United States Patent
Li et al.

(10) Patent No.: US 10,490,670 B2
(45) Date of Patent: Nov. 26, 2019

(54) MANUFACTURING METHOD OF ARRAY SUBSTRATE, ARRAY SUBSTRATE WITH ACTIVE LAYER BEING ABOVE FIRST ELECTRODE, AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Feng Li, Beijing (CN); Dawei Shi, Beijing (CN); Fengguo Wang, Beijing (CN); Hong Liu, Beijing (CN); Xinguo Wu, Beijing (CN); Zifeng Wang, Beijing (CN); Bo Ma, Beijing (CN); Zhixuan Guo, Beijing (CN); Yuanbo Li, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/754,120

(22) PCT Filed: Jun. 20, 2017

(86) PCT No.: PCT/CN2017/089168
§ 371 (c)(1),
(2) Date: Feb. 21, 2018

(87) PCT Pub. No.: WO2018/099052
PCT Pub. Date: Jun. 7, 2018

(65) Prior Publication Data
US 2019/0013409 A1    Jan. 10, 2019

(30) Foreign Application Priority Data

Dec. 1, 2016    (CN) .......................... 2016 1 1091449

(51) Int. Cl.
*H01L 29/786* (2006.01)
*H01L 29/66* (2006.01)
(Continued)

(52) U.S. Cl.
CPC ...... *H01L 29/78675* (2013.01); *H01L 27/124* (2013.01); *H01L 27/1259* (2013.01);
(Continued)

(58) Field of Classification Search
CPC . H01L 27/3244–3279; H01L 29/78765; H01L 20/78633; H01L 29/78645;
(Continued)

(56) References Cited

U.S. PATENT DOCUMENTS

2014/0292622 A1* 10/2014 Lee ...................... G09G 3/3233
345/80
2016/0093647 A1* 3/2016 Kim .................. G02F 1/136227
349/46
2017/0294497 A1* 10/2017 Lius .................... H01L 27/1255

FOREIGN PATENT DOCUMENTS

CN    103094354 A    5/2013
CN    103268878 A    8/2013
(Continued)

OTHER PUBLICATIONS

International Search Report and Written Opinion dated Sep. 6, 2017; PCT/CN2017/089168.
(Continued)

*Primary Examiner* — Daniel Whalen
*Assistant Examiner* — Suberr L Chi

(57) ABSTRACT

A manufacturing method of an array substrate, an array substrate and a display device are provided. The method
(Continued)

includes: forming a first electrode; forming a first insulation layer on the first electrode; forming a first via hole in the first insulation layer; forming an active layer on the first insulation layer, which is electrically connected with the first electrode through the first via hole; forming a gate insulation layer on the active layer; forming a first gate electrode on the gate insulation layer, which overlaps with at least part of the active layer; forming a second insulation layer on the first gate electrode and the gate insulation layer, forming a second via hole in the second insulation layer and the gate insulation layer; forming a pixel electrode on the second insulation layer, which is electrically connected with the active layer through the second via hole.

17 Claims, 11 Drawing Sheets

(51) Int. Cl.
| | | |
|---|---|---|
| *H01L 27/12* | (2006.01) | |
| *G02F 1/1362* | (2006.01) | |
| *H01L 29/45* | (2006.01) | |
| *H01L 29/49* | (2006.01) | |
| *H01L 21/285* | (2006.01) | |
| *H01L 21/02* | (2006.01) | |
| *H01L 21/266* | (2006.01) | |
| *G02F 1/1368* | (2006.01) | |
| *H01L 27/32* | (2006.01) | |
| *G02F 1/167* | (2019.01) | |
| *H01L 21/027* | (2006.01) | |
| *H01L 21/265* | (2006.01) | |

(52) U.S. Cl.
CPC .... *H01L 27/1288* (2013.01); *H01L 29/66757* (2013.01); *H01L 29/66969* (2013.01); *H01L 29/78603* (2013.01); *H01L 29/78621* (2013.01); *H01L 29/78633* (2013.01); *H01L 29/78645* (2013.01); *G02F 1/1368* (2013.01); *G02F 1/136209* (2013.01); *G02F 1/136227* (2013.01); *G02F 1/136286* (2013.01); *G02F 1/167* (2013.01); *G02F 2001/13685* (2013.01); *G02F 2202/104* (2013.01); *H01L 21/0262* (2013.01); *H01L 21/0273* (2013.01); *H01L 21/02532* (2013.01); *H01L 21/02592* (2013.01); *H01L 21/02667* (2013.01); *H01L 21/266* (2013.01); *H01L 21/26513* (2013.01); *H01L 21/2855* (2013.01); *H01L 27/1218* (2013.01); *H01L 27/1274* (2013.01); *H01L 27/3248* (2013.01); *H01L 27/3262* (2013.01); *H01L 27/3272* (2013.01); *H01L 27/3276* (2013.01); *H01L 29/456* (2013.01); *H01L 29/4908* (2013.01); *H01L 29/7869* (2013.01); *H01L 2227/323* (2013.01)

(58) Field of Classification Search
CPC .......... H01L 29/6675; H01L 29/78696; H01L 29/78642; H01L 29/78672–78678; H01L 29/78633; H01L 21/76802–76817; H01L 21/76877–76883
See application file for complete search history.

(56) References Cited

FOREIGN PATENT DOCUMENTS

| | | | |
|---|---|---|---|
| CN | 103762218 | A | 4/2014 |
| CN | 103765597 | A | 4/2014 |
| CN | 104851789 | A | 8/2015 |
| CN | 106024906 | A | 10/2016 |
| CN | 106158882 | A | 11/2016 |
| CN | 106531692 | A | 3/2017 |

OTHER PUBLICATIONS

The Chinese Search Report, Entrust date Apr. 27, 2017; Appln. No. 201611091449.9.
The First Chinese Office Action dated Jul. 5, 2017; Appln. No. 201611091449.9.
The Second Chinese Office Action dated Sep. 14, 2017; Appln. No. 201611091449.9.
The Third Chinese Office Action dated Nov. 14, 2017; Appln. No. 20161109149.9.

* cited by examiner

MANUFACTURING METHOD OF ARRAY SUBSTRATE, ARRAY SUBSTRATE WITH ACTIVE LAYER BEING ABOVE FIRST ELECTRODE, AND DISPLAY DEVICE

TECHNICAL FIELD

Embodiments of the present disclosure relate to a manufacturing method of an array substrate, an array substrate and a display device.

BACKGROUND

With the development of display technology, flat panel display devices, such as a liquid crystal display (LCD), have advantages of high display quality, low power consumption, small thickness and wide range of applications, etc., and thus have been widely used in mobile phones, televisions, personal digital assistants, digital cameras, notebook computers, desktop computers and other consumptive electronic products, and the LCD has become the mainstream of the flat panel display devices.

A polysilicon (PS) thin film transistor (TFT) LCD is different from a traditional amorphous silicon TFT-LCD. Because lattice arrangement of polysilicon is regular, electron mobility of the polysilicon is over 200 cm2/V-sec. In a case that the polysilicon acts as an active layer of the thin film transistor, area of the thin film transistor is effectively reduced, so that aperture ratio is improved, and whole power consumption is reduced while brightness of the display device is enhanced. In addition, in a case that the active layer of the thin film transistor has high electron mobility, a part of drive circuits may be integrated on a glass substrate of the display device, which reduces a number of drive chips and greatly enhances reliability of the LCD panel. Therefore, the polysilicon TFT-LCD, especially a low temperature polysilicon (LTPS) TFT-LCD, has gradually become a research focus in the display field.

SUMMARY

At least one embodiment of the present disclosure provides a manufacturing method of an array substrate. The method comprises: providing a base substrate; forming a first electrode on the base substrate; forming a first insulation layer on the first electrode, and forming a first via hole in the first insulation layer; forming an active layer on the first insulation layer, the active layer being electrically connected with the first electrode through the first via hole; forming a gate insulation layer on the active layer; forming a first gate electrode on the gate insulation layer, the first gate electrode overlapping with at least part of the active layer in a direction perpendicular to the base substrate; forming a second insulation layer on the first gate electrode and the gate insulation layer, and forming a second via hole in the second insulation layer and the gate insulation layer; and forming a pixel electrode on the second insulation layer, the pixel electrode being electrically connected with the active layer through the second via hole.

For example, the manufacturing method of the array substrate provided by the embodiments of the present disclosure further comprises: forming a common electrode on the second insulation layer. The common electrode and the pixel electrode are located in a same layer, and branch electrode strips of the common electrode and branch electrode strips of the pixel electrode are at least partially interdigitated with each other.

For example, the manufacturing method of the array substrate provided by the embodiments of the present disclosure further comprises: forming a common electrode on the second insulation layer; forming a third insulation layer on the common electrode, and forming a third via hole overlapping with the second via hole in the third insulation layer; and forming the pixel electrode on the third insulation layer, the pixel electrode being electrically connected with the active layer through the second via hole and the third via hole.

For example, the manufacturing method of the array substrate provided by the embodiments of the present disclosure further comprises: forming a fourth insulation layer on the pixel electrode; and forming a common electrode on the fourth insulation layer.

For example, the manufacturing method of the array substrate provided by the embodiments of the present disclosure further comprises: forming a light shielding layer during forming the first electrode. The light shielding layer overlaps with at least part of the active layer in the direction perpendicular to the base substrate.

For example, in the manufacturing method of the array substrate provided by the embodiments of the present disclosure, the active layer is an amorphous silicon layer, a polysilicon layer or an oxide semiconductor layer.

For example, in the manufacturing method of the array substrate provided by the embodiments of the present disclosure, the active layer is the polysilicon layer, the manufacturing method of the array substrate further comprises: doping the polysilicon layer to obtain a channel region, a first doping region located on two sides of the channel region, and a second doping region located on a side of the first doping region away from the channel region. Doping concentration of the first doping region is less than doping concentration of the second doping region.

For example, the manufacturing method of the array substrate provided by the embodiments of the present disclosure further comprises: forming a second gate electrode on the gate insulation layer. The second gate electrode overlaps with at least part of the active layer in the direction perpendicular to the base substrate.

At least one embodiment of the present disclosure further provides an array substrate. The array substrate comprises: a base substrate; a first electrode disposed on the base substrate; a first insulation layer disposed on the first electrode, and a first via hole disposed in the first insulation layer; an active layer disposed on the first insulation layer, the active layer being electrically connected with the first electrode through the first via hole; a gate insulation layer disposed on the active layer; a first gate electrode disposed on the gate insulation layer, and the first gate electrode overlapping with at least part of the active layer in a direction perpendicular to the base substrate; a second insulation layer disposed on the gate insulation layer and the first gate electrode, and a second via hole disposed in the gate insulation layer and the second insulation layer; and a pixel electrode disposed on the second insulation layer, the pixel electrode being electrically connected with the active layer through the second via hole.

For example, the array substrate provided by the embodiments of the present disclosure further comprises a common electrode disposed on the second insulation layer. The common electrode and the pixel electrode are located in a same layer, and branch electrode strips of the common electrode and branch electrode strips of the pixel electrode are at least partially interdigitated with each other.

For example, the array substrate provided by the embodiments of the present disclosure further comprises a common electrode disposed on the second insulation layer; a third insulation layer disposed on the common electrode, a third via hole, which overlaps with the second via hole, disposed in the third insulation layer; and the pixel electrode disposed on the third insulation layer and being electrically connected with the active layer through the second via hole and the third via hole.

For example, the array substrate provided by the embodiments of the present disclosure further comprises a fourth insulation layer disposed on the pixel electrode; and a common electrode disposed on the fourth insulation layer.

For example, the array substrate provided by an embodiment of the present disclosure further comprises a light shielding layer disposed in a same layer with the first electrode. The light shield layer overlaps with at least part of the active layer in the direction perpendicular to the base substrate.

For example, in the array substrate provided by the embodiments of the present disclosure, the active layer is an amorphous silicon layer, a polysilicon layer or an oxide semiconductor layer.

For example, the array substrate provided by the embodiments of the present disclosure further comprises a second gate electrode disposed on the gate insulation layer. The second gate electrode overlaps with at least part of the active layer in the direction perpendicular to the base substrate.

At least one embodiment of the present disclosure further provides a display device, comprising the array substrate mentioned in any one of the above embodiments.

The embodiments of the present disclosure provide the manufacturing method of the array substrate, the array substrate and the display device. In the manufacturing method of the array substrate, before forming the active layer, the via hole for connecting the active layer with the source-drain electrode is formed, so that the active layer is not etched when etching the via hole, the quality of the active layer is improved. In addition, the active layer contacts with the source-drain electrode through the via hole in the mode of surface contact, so as to improve the contact resistance. Furthermore, in some examples, the manufacturing method omits the process of forming the light shielding layer individually, so as to reduce manufacturing process steps, shorten production time, reduce production cost and effectively improve production capacity.

It is to be understood that the above general description of the present disclosure and the following detailed description are both illustrative and explanatory, and are intended to further illustrate the present disclosure.

BRIEF DESCRIPTION OF THE DRAWINGS

In order to clearly illustrate the technical solution of embodiments of the present disclosure, the drawings of the embodiments or related technical description will be briefly described in the following; it is obvious that the drawings in the description are only related to some embodiments of the present disclosure and thus are not limitative to the present disclosure.

FIG. 1b is a schematic diagram of a sectional structure taken along a line A-A' in FIG. 1a;

FIG. 13b is another schematic diagram of the sectional structure taken along a line B-B' in FIG. 13a.

DETAILED DESCRIPTION

Figure 1A:
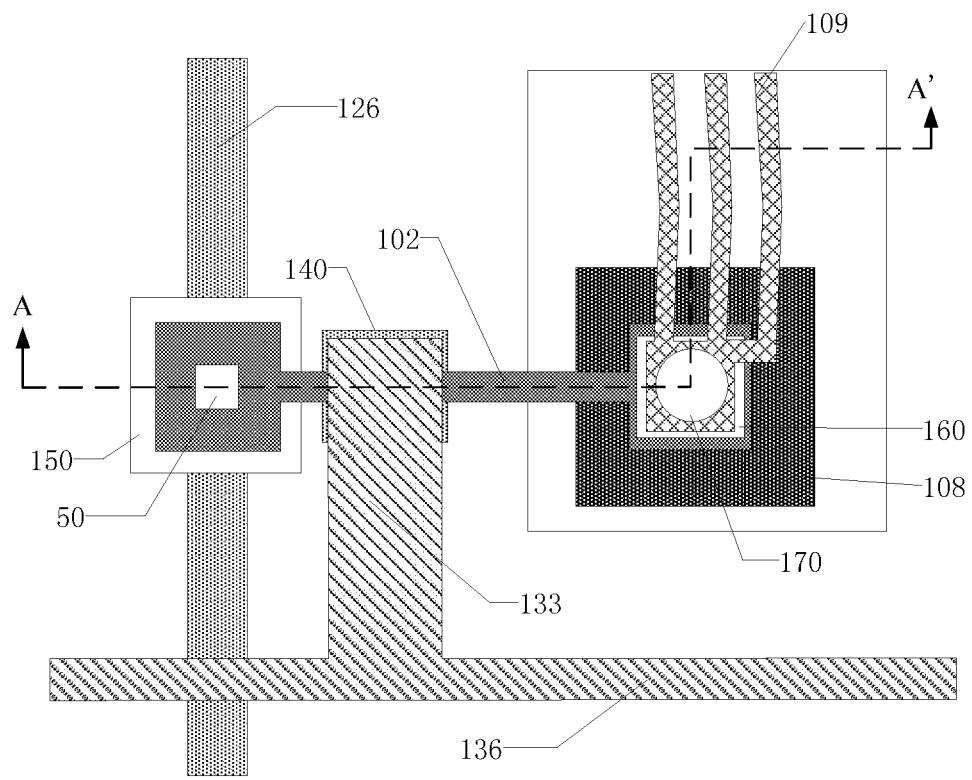
FIG. 1a is a planar view of an array substrate provided by embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "Over," "under," "right," "left" and the like are only used to indicate relative position relationship, and when the position of the object which is described is changed, the relative position relationship may be changed accordingly.

Each component or structure in the drawings is not drawn strictly in a real scale, for clarity, a size of each component or structure may be exaggerated or reduced, such as increasing a thickness of a layer, a width of an electrode, etc. but these are not intended to limit to the protection scope of the present disclosure.

A manufacturing process of a thin film transistor array substrate for example comprises sequentially forming a light shielding layer, a buffer layer, an active layer, an insulation layer, a metal gate electrode layer, a passivation layer, a source-drain electrode layer and a pixel electrode layer, etc. on a base substrate. In the above process of manufacturing the thin film transistor array substrate, a via hole, which is configured to connect the active layer and the source-drain electrode, needs to be formed in the insulation layer; during forming the via hole by etching, the active layer may be etched simultaneously, so that the quality of the active layer is reduced. In addition, in a case that the source-drain electrode contacts with the active layer in a mode of side contact, a risk of poor contact exists. In addition, the above manufacturing process is complex, and the production cost is high.

At least one embodiment of the present disclosure provides a manufacturing method of an array substrate, an array substrate manufactured by the manufacturing method and a display device having the array substrate.

The manufacturing method of the array substrate provided according to the embodiments of the present disclosure comprises: providing a base substrate; forming a first electrode on the base substrate; forming a first insulation layer on the first electrode, and forming a first via hole in the first insulation layer; forming an active layer on the first insulation layer, the active layer being electrically connected with the first electrode through the first via hole; forming a gate insulation layer on the active layer; forming a first gate electrode on the gate insulation layer, the first gate electrode overlapping with at least part of the active layer in a direction perpendicular to the base substrate; forming a second insulation layer on the first gate electrode and the gate insulation layer, and forming a second via hole in the second insulation layer and the gate insulation layer; and forming a pixel electrode on the second insulation layer, the pixel electrode being electrically connected with the active layer through the second via hole.

The manufacturing method of the array substrate avoids etching the active layer during forming a source-drain electrode, so as to improve the quality of the active layer; moreover, a contact mode between the source-drain electrode and the active layer is optimized from a mode of side contact to a mode of surface contact, so as to improve electric contact between the source-drain electrode and the active layer, and reduce the contact resistance.

For example, the manufacturing method of the array substrate provided by the embodiments of the present disclosure further comprises forming a light shielding layer simultaneously during forming the first electrode. The light shielding layer and the active layer at least partially overlap with each other in the direction perpendicular to the base substrate. Thus, the manufacturing method of the embodiments omits a step of forming the light shielding layer individually, so that the production time is shortened, the production capacity is improved, the cost is saved, and the process steps are reduced.

The embodiments of the present disclosure provide an array substrate, comprising: a base substrate; a first electrode disposed on the base substrate; a first insulation layer disposed on the first electrode, and a first via hole disposed in the first insulation layer; an active layer disposed on the first insulation layer, the active layer being electrically connected with the first electrode through the first via hole; a gate insulation layer disposed on the active layer; a first gate electrode disposed on the gate insulation layer, and the first gate electrode overlapping with at least part of the active layer in a direction perpendicular to the base substrate; a second insulation layer disposed on the gate insulation layer and the first gate electrode, a second via hole disposed in the gate insulation layer and the second insulation layer; and a pixel electrode disposed on the second insulation layer, the pixel electrode being electrically connected with the active layer through the second via hole.

The array substrate improves the quality of the active layer; moreover, a contact mode between a source-drain electrode and the active layer is optimized from a mode of side contact to a mode of surface contact, the contact resistance is reduced, and therefore the electric contact between the source-drain electrode and the active layer is improved. The array substrate has effects, such as shortening the production time, effectively improving the production capacity, saving costs, and reducing the process steps.

For example, the array substrate provided by the embodiments of the present disclosure further comprises a light shielding layer disposed in a same layer with the first electrode, the light shield layer overlaps with at least part of the active layer in the direction perpendicular to the base substrate. The manufacturing method of the array substrate does not need an individual step of forming the light shielding layer, so as to further improve the production capacity, save the cost, and reduce the process steps.

Several embodiments of the present disclosure are described in detail below, but the present disclosure is not limited to these specific embodiments.

Embodiment 1

Figure 1B:
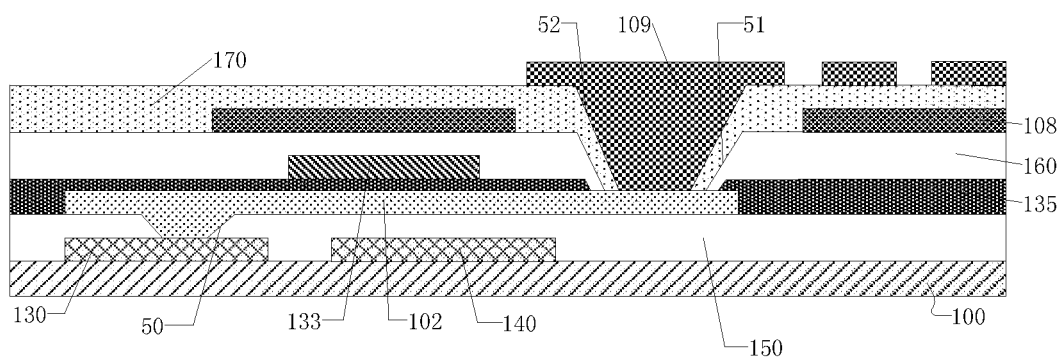

FIG. 1a shows a planar view of an array substrate provided by the embodiments of the disclosure, FIG. 1b is a schematic diagram of a sectional structure taken along a line A-A' in FIG. 1a. FIGS. 2a-8b are structural views of a manufacturing method of an array substrate provided by the embodiments of the disclosure.

As shown in FIG. 1a and FIG. 1b, the array substrate of the embodiment 1 comprises: a base substrate 100; a first electrode 130 disposed on the base substrate 100; a first insulation layer 150 disposed on the first electrode 130; an active layer 102 disposed on the first insulation layer 150; a gate insulation layer 135 disposed on the active layer 102; a first gate electrode 133 disposed on the gate insulation layer 135; a second insulation layer 160 disposed on the gate insulation layer 135 and the first gate electrode 133; a common electrode 108 disposed on the second insulation layer 160; a third insulation layer 170 disposed on the common electrode 108; and a pixel electrode 109 disposed on the third insulation layer 170.

A first via hole 50 is disposed in the first insulation layer 150; the active layer 102 is electrically connected with the first electrode 130 through the first via hole 50, the first gate electrode 133 overlaps with at least part of the active layer 102 in a direction perpendicular to the base substrate 100, a second via hole 51 is disposed in the second insulation layer 160, and the second via hole 51 penetrates through the gate insulation layer 135 and exposes a part of the active layer 102. The third insulation layer 170 comprises a third via hole 52 that exposes a part of the active layer 102 and overlaps with the second via hole 51, and the pixel electrode 109 is electrically connected with the active layer 102 through the second via hole 51 and the third via hole 52.

The array substrate further comprises a data line 126 and a gate line 136, as shown in FIG. 1a and FIG. 1b, the data line 126 extends in a vertical direction, the gate line 136 extends in a horizontal direction, and the data line 126 and the gate line 136 cross each other to define a pixel region, for example, a thin film transistor is formed at a cross position of the data line 126 and the gate line 136. For example, the first electrode 130 is integrally formed with the data line 126, and the first gate electrode 133 is integrally formed with the gate line 136. Although only one pixel region is shown in figures, a person having ordinary skill in the art should know that the array substrate may comprise a plurality of pixel regions, and the plurality of pixel regions is arranged in an array to form a display region.

The first electrode 130, the active layer 102, the first gate electrode 133, the gate insulation layer 135 and the pixel electrode 109 constitutes a thin film transistor, and the thin film transistor acts as a switch element of the pixel region defined by the data line 126 and the gate line 136. Herein, the first electrode 130 is a source electrode or a drain electrode, and accordingly, a part of the pixel electrode 109 contacting the active layer 102 is the drain electrode or the source electrode. In a case that a turn-on signal (ON) is applied to the gate line 136, the thin film transistor is turned on, so that the pixel electrode 109 is electrically connected with the data line 126, a signal applied on the data line 126 is transmitted to the pixel electrode 109; in a case that a turn-off signal (OFF) is applied to the gate line 136, the thin film transistor is turned off, so that the pixel electrode 109 is disconnected from the data line 126.

It is to be noted that, the first insulation layer 150, the gate insulation layer 135 and the second insulation layer 160, for example, are formed on the base substrate 100 to cover all of the pixel regions (or an entirety of the display region); however, in FIG. 1a and FIG. 1b, in order to show layer structures more clearly, only parts of the first insulation layer 150, the gate insulation layer 135 and the second insulation layer 160 are shown, but this does not indicated that these layers only comprise these parts. Similarly, for example, FIG. 1a and FIG. 1b only show parts of the pixel electrode 109, the common electrode 108 and the like for simplicity.

Furthermore, the array substrate for example comprises a light shielding layer 140 disposed on the base substrate 100, the light shielding layer 140 is separated from the data line 126 and the first electrode 130, and overlaps with at least part of the active layer 102 in the direction perpendicular to the base substrate 100, so as to prevent or reduce light irradiated from a side of the base substrate 100 (such as a side of the base substrate 100 facing a backlight source) from irradiating onto the active layer 102.

For example, the base substrate 100 is a transparent insulation substrate, such as a glass substrate, a quartz substrate, or other suitable substrates.

For example, materials of the first electrode 130, the data line 126 and the light shielding layer 140 comprise copper base metals, aluminum base metals, nickel base metals and so on. For example, the copper base metals comprises copper base alloy with stable properties, such as copper (Cu), copper zinc alloy (CuZn), copper nickel alloy (CuNi) or copper zinc nickel alloy (CuZnNi), etc. The copper base metals have characteristics of low resistivity and good conductivity, so as to improve a signal transmission rate of the source electrode and the drain electrode, and then improve the quality of display.

For example, an exemplary material of the first insulation layer 150 comprises silicon nitride (SiNx), silicon oxide (SiOx), silicon oxynitride (SiNxOy) or other suitable materials.

For example, a material of the active layer 102 is amorphous silicon, polysilicon, oxide semiconductor or other suitable materials. The polysilicon for example is high temperature polysilicon or low temperature polysilicon; the oxide semiconductor, for example, is indium gallium zinc oxide (IGZO), indium zinc oxide (IZO), zinc oxide (ZnO) or gallium zinc oxide (GZO), etc.

For example, materials of the first gate electrode 133 and gate line 136 are copper (Cu), copper molybdenum alloy (Cu/Mo), or chromium base metal, such as chromium molybdenum alloy (Cr/Mo), chromium titanium alloy (Cr/Ti), or aluminum (Al), aluminum alloy or other suitable materials.

For example, a material of the second insulation layer 160 comprises silicon nitride (SiNx), silicon oxide (SiOx), silicon oxynitride (SiNxOy) or other suitable materials.

For example, a material of the common electrode 108 is a transparent conductive material, a metal material or other suitable materials. For example, the material of the common electrode 108 comprises indium tin oxide (ITO) or indium zinc oxide (IZO), etc.

For example, a material of the third insulation layer 170 comprises silicon nitride (SiNx), silicon oxide (SiOx), silicon oxynitride (SiNxOy) or other suitable materials (for example, organic resin material).

For example, a material of the pixel electrode 109 is a transparent conductive material, a metal material or other suitable materials, for example, the material of the pixel electrode 109 comprises indium tin oxide (ITO) or indium zinc oxide (IZO) and so on. As shown in the figure, the pixel electrode 109 is a slit electrode including a plurality of slits parallel to each other. In the embodiment, the pixel electrode 109 and the common electrode 108 are formed on different layers, and the array substrate, for example, is used in an advanced super dimension switch (ADS for short) type liquid crystal display panel.

The manufacturing method of the array substrate described in the above embodiment will be illustrated below in conjunction with FIG. 2a to FIG. 8b. FIG. 2b, FIG. 3b, FIG. 4b, FIG. 5b, FIG. 6b, FIG. 7b and FIG. 8b are sectional views of FIG. 2a, FIG. 3a, FIG. 4a, FIG. 5a, FIG. 6a, FIG. 7a and FIG. 8a respectively along the line A-A' as in FIG. 1a. FIG. 2a, FIG. 3a, FIG. 4a, FIG. 5a, FIG. 6a, FIG. 7a and FIG. 8a still only show a part of related structures for the purpose of more clear illustration.

In the embodiments of the present disclosure, a patterning process, for example, is a photolithography patterning process that comprises: first coating a photoresist film on a structure layer that needs to be patterned, the coating of the photoresist film being performed for example by spin coating, scraping coating or roll coating, etc.; next exposing the photoresist film by a photolithography mask, and developing the exposed photoresist film to obtain a photoresist pattern; then etching the structure layer with the photoresist pattern to remove a portion of the structure layer that is not covered by the photoresist pattern; finally stripping the photoresist pattern to form the patterned structure layer.

Figure 2A:
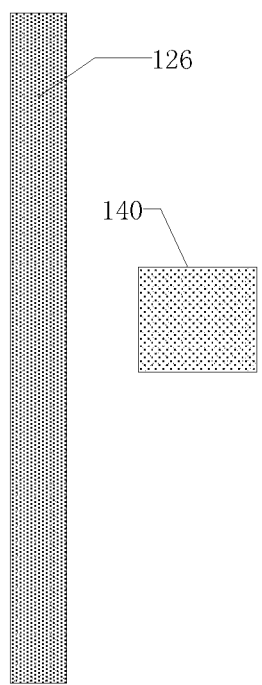
FIGS. 2a-8b are structural views of a manufacturing method of the array substrate provided by the embodiments of the present disclosure.

As shown in FIG. 2a, the base substrate 100 is provided, and the first electrode 130, the data line 126 and the light shielding layer 140 are formed on the base substrate 100.

For example, the base substrate 100 is a transparent insulation substrate, and an example of the base substrate 100 is a glass substrate, a quartz substrate, or other suitable substrates.

Figure 2B:
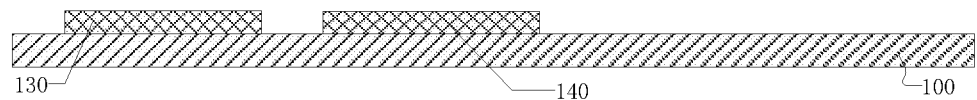

For example, as shown in FIG. 2b, in order to form the first electrode 130, the data line 126 and the light shielding layer 140, a metal thin film is deposited on the base substrate 100 by methods such as a vapor deposition method, a magnetron sputtering method and a vacuum evaporation method, and then the metal thin film is patterned so that the first electrode 130, the data line 126 and the light shielding layer 140 are formed on the base substrate 100 simultaneously.

For example, a material of the metal thin film is one or more metals selected from the group including titanium, tantalum, copper, aluminum, molybdenum, chromium or other suitable materials, or one or more alloys formed by any combination of the metals mentioned above; for example, the metal thin film is a single layer structure or a multilayer structure, and accordingly, the first electrode 130, the data line 126 and the light shielding layer 140 are the single layer structure or the multilayer structure.

It is to be noted that, in the embodiment, as shown in FIG. 2a, the data line 126 is formed simultaneously during forming the first electrode 130, so that the data line 126 is integrally formed with the first electrode 130. Of course, the data line 126 and the first electrode 130 may be not an integral structure provided that the data line 126 and the first electrode 130 are electrically connected with each other, and then the identical technical effect is achieved.

Figure 3A:
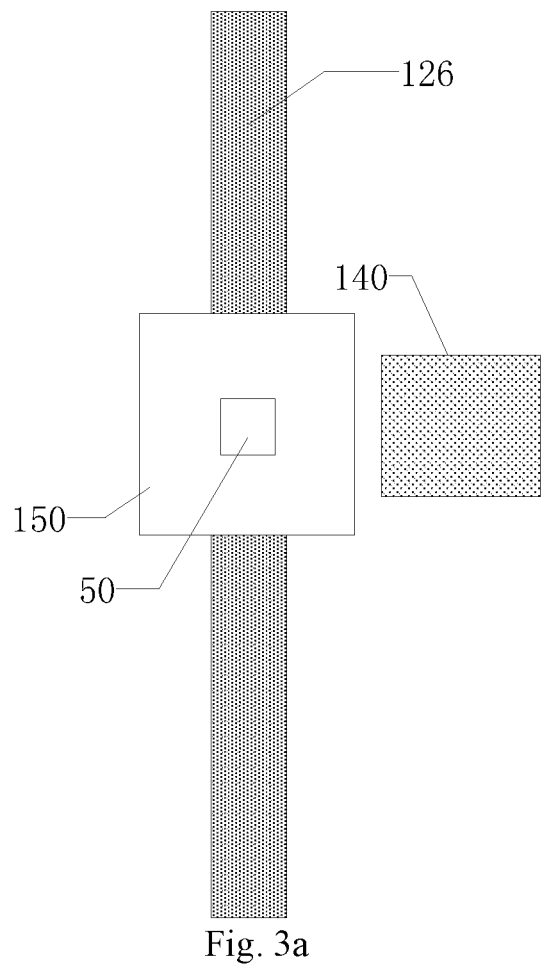
Figure 3B:
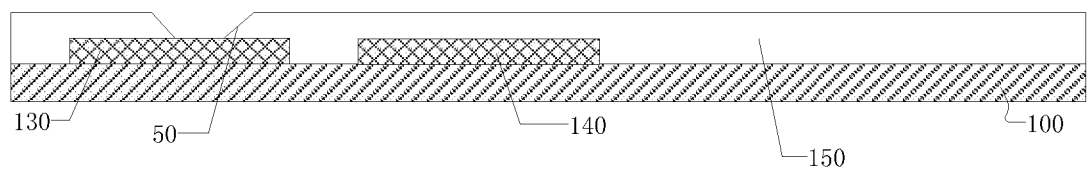

For example, as shown in FIG. 3a and FIG. 3b, an insulation film is deposited on the base substrate 100 on which the first electrode 130 and the light shielding layer 140 are formed, then the insulation film is patterned to form the first insulation layer 150, and the first via hole 50, that exposes a part of the first electrode 130, is formed in the first insulation layer 150 simultaneously. The first insulation layer 150 prevents harmful impurities and ions in the base substrate 100 from diffusing into the active layer 102 that will be described later, so as to eliminate various problems caused by the base substrate 100. The first insulation layer 150 also acts as a buffer layer, and therefore the manufacturing method of the embodiment does not need to form the buffer layer individually to cover the base substrate 100, so as to reduce the process steps.

Figure 4A:
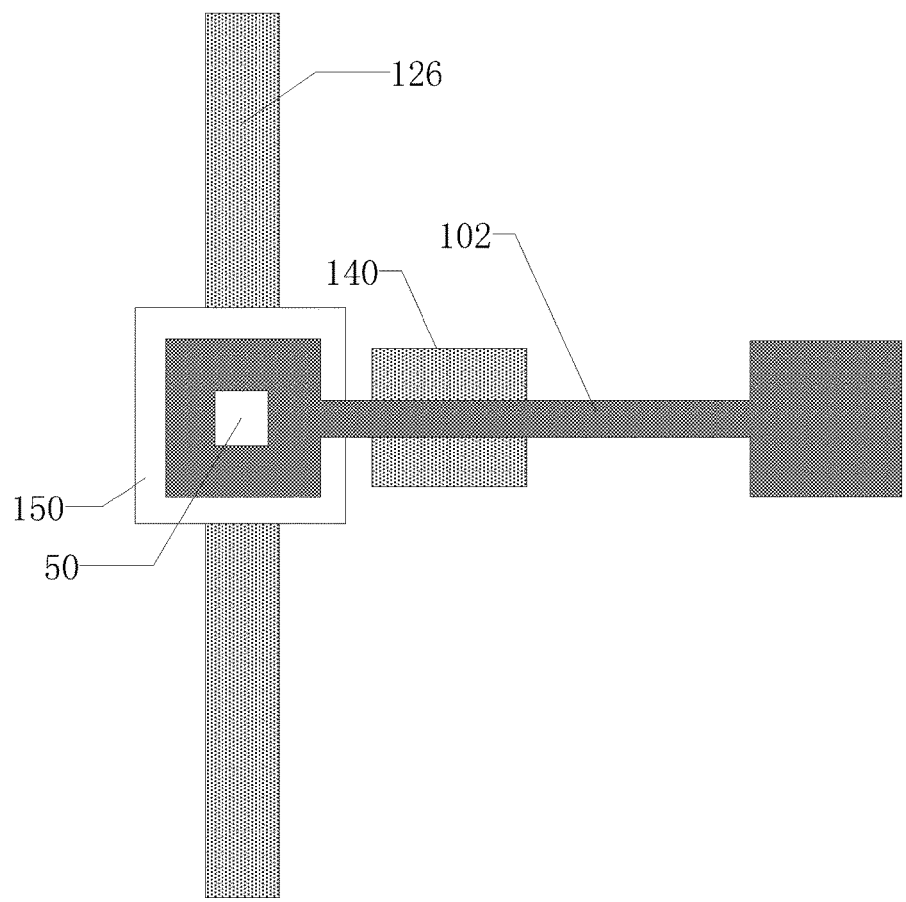
Figure 4B:
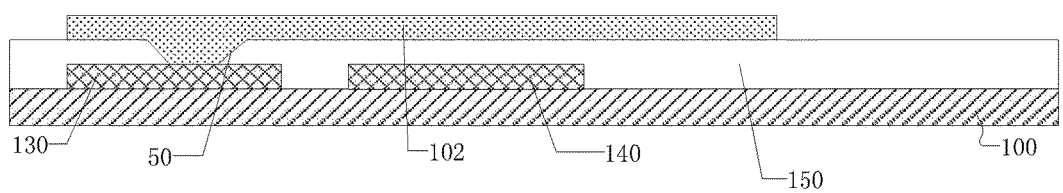

For example, as shown in FIG. 4a and FIG. 4b, a semiconductor film is deposited on the base substrate 100 on which the first electrode 130, the light shielding layer 140 and the first insulation layer 150 are formed, then the semiconductor film is patterned to form the active layer 102, the active layer 102 is electrically connected with the first electrode 130 through the first via hole 50. Herein, the contact between the first electrode 130 and the active layer 102 is the surface contact, so as to reduce the contact resistance.

It is to be noted that, the thin film transistor in the embodiment is a thin film transistor with a top gate type structure, therefore, in order to prevent the light emitted by the backlight source from irradiating onto the active layer 102, resulting in generation of photo-generated carriers and affecting the electrical characteristics of the thin film transistor, such as the increase of the leakage current of the thin film transistor and so on, the active layer 102 needs to be shielded against light. In the embodiment, as shown in FIG. 4b, for example, the light shielding layer 140 and the active layer 102 at least partially overlap with each other in the direction perpendicular to the base substrate 100, and the light shielding layer 140 is used to shield the active layer 102 from light. Therefore, the manufacturing method of the embodiment of the present disclosure does not need to form the light shielding layer individually, so as to reduce the process steps, shorten manufacturing time, and reduce the production cost.

Figure 5A:
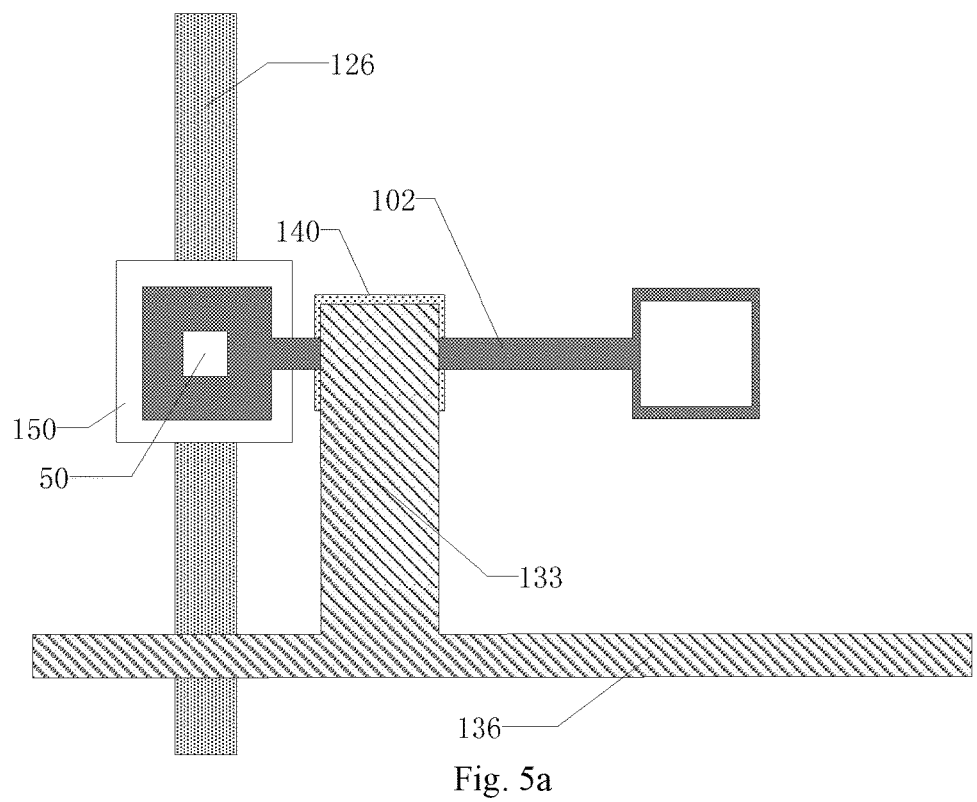
Figure 5B:
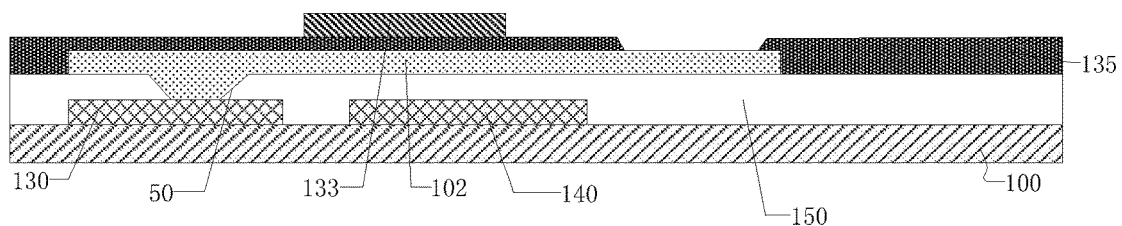

For example, as shown in FIG. 5a and FIG. 5b, an insulation film is deposited on the base substrate 100 on which the first electrode 130, the light shielding layer 140, the first insulation layer 150 and the active layer 102 are formed, so as to form the gate insulation layer 135; after forming the gate insulation layer 135, a gate metal thin film is deposited on the gate insulation layer 135, then the gate metal thin film is patterned to form the first gate electrode 133. In the step, the gate insulation layer 135 for example is further patterned to form a via hole that exposes a part of the active layer 102.

It is to be noted that, the gate line 136 electrically connected to the first gate electrode 133 is formed simultaneously during forming the first gate electrode 133, as shown in FIG. 5a. In the embodiment, the gate line 136 is branched to form the first gate electrode 133, and therefore a gate signal is applied to the first gate electrode 133 through the gate line 136. The first gate electrode 133 and the active layer 102 at least partially overlap with each other in the direction perpendicular to the base substrate 100, for example, the first gate electrode 133 completely overlaps with a channel region of the active layer 102.

Figure 6A:
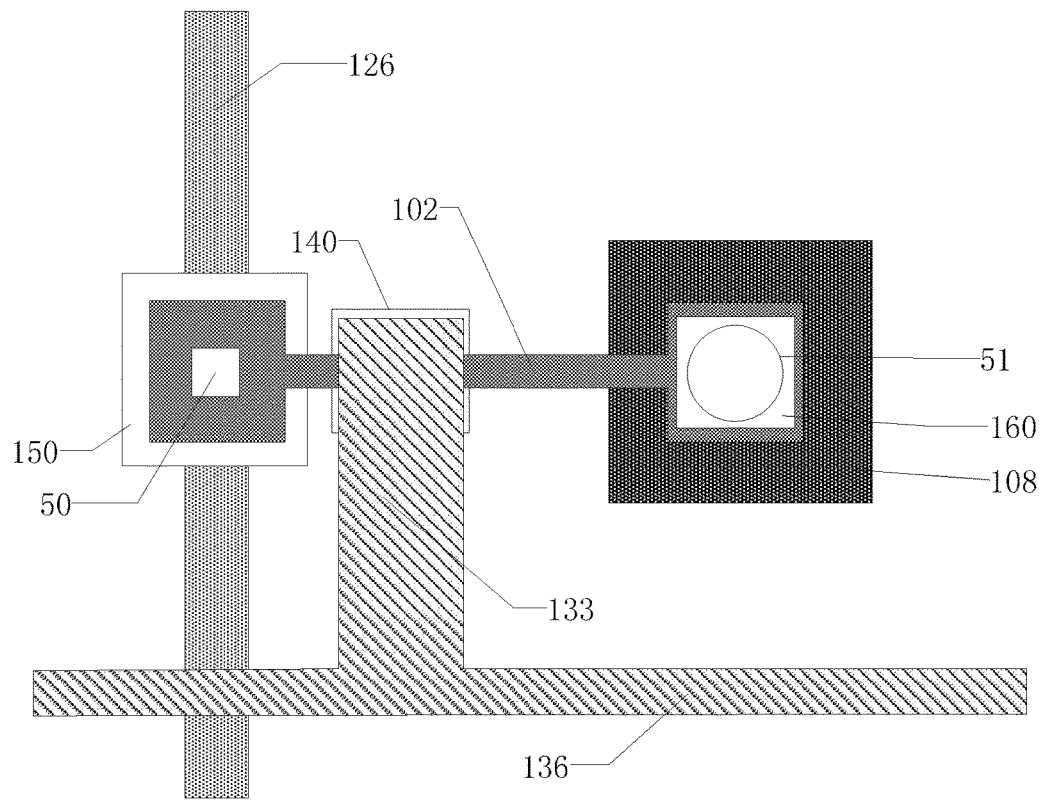
Figure 6B:
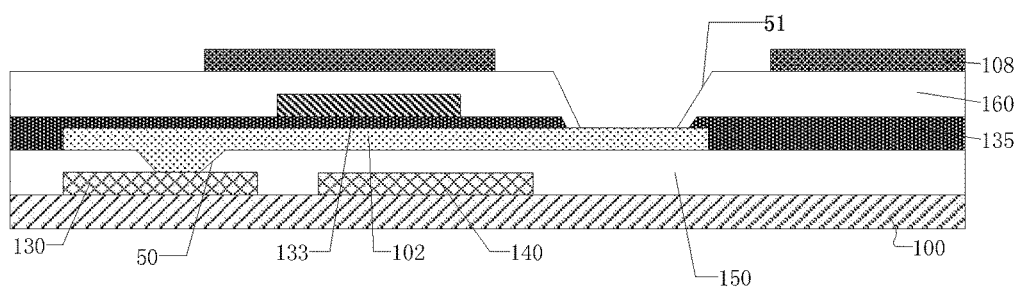

For example, as shown in FIG. 6a and FIG. 6b, an insulation film is deposited on the base substrate 100 on which the first electrode 130, the light shielding layer 140, the first insulation layer 150, the active layer 102, the first gate electrode 133 and the gate insulation layer 135 are formed, and the second insulation layer 160 is formed by a patterning process. The second insulation layer 160 comprises the second via hole 51, and the second via hole 51 corresponds to the via formed in the gate insulation layer 135, that is, the second via hole 51 exposes the via formed in the gate insulation layer 135. Then a transparent conductive thin film is deposited on the second insulation layer 160, and the common electrode 108 is formed by patterning the transparent conductive thin film. The common electrode 108 comprises an open corresponding to the second via hole 51 to expose the second via hole 51, the open for example is a closed open or a non-closed open.

It is to be noted that, the via hole in the gate insulation layer 135 and the via hole 51 in the second insulation layer 160 are formed respectively. Certainly, in a case that the via hole is not formed in the gate insulation layer 135 in the previous step, the second via hole 51 is formed in both of the gate insulation layer 135 and the second insulation layer 160 by a same patterning process after the formation of the second insulation layer 160, especially, in a case that the gate insulation layer 135 and the second insulation layer 160 are formed with a same material, a patterning process for forming the second via hole 51 becomes simpler.

Figure 7A:
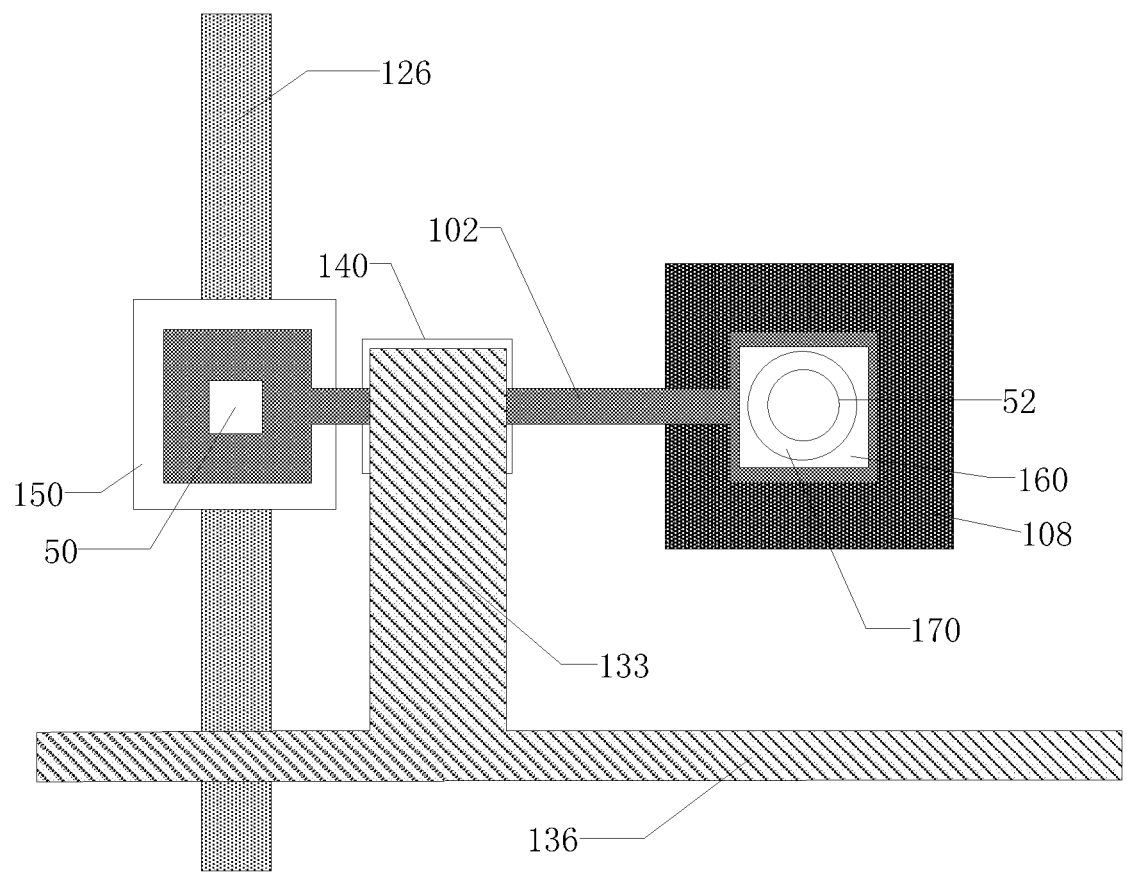
Figure 7B:
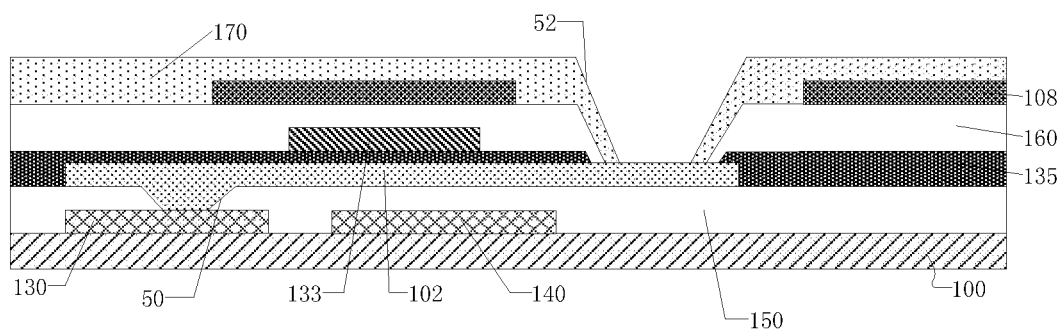

For example, as shown in FIG. 7a and FIG. 7b, an insulation film is deposited on the common electrode 108 and the second insulation layer 160, then the third insulation layer 170 is formed by patterning the insulation film, the third via hole 52 overlapping with the second via hole 51 is formed in the third insulation layer 170, and the third via hole 52 exposes a part of the active layer 102 through the second via hole 51.

Figure 8A:
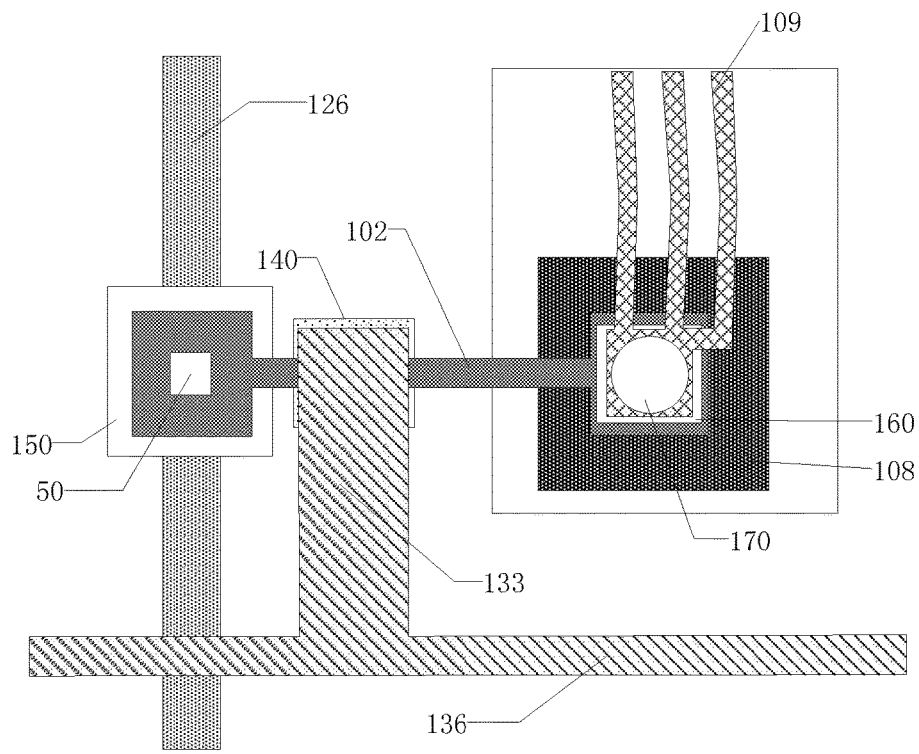
Figure 8B:
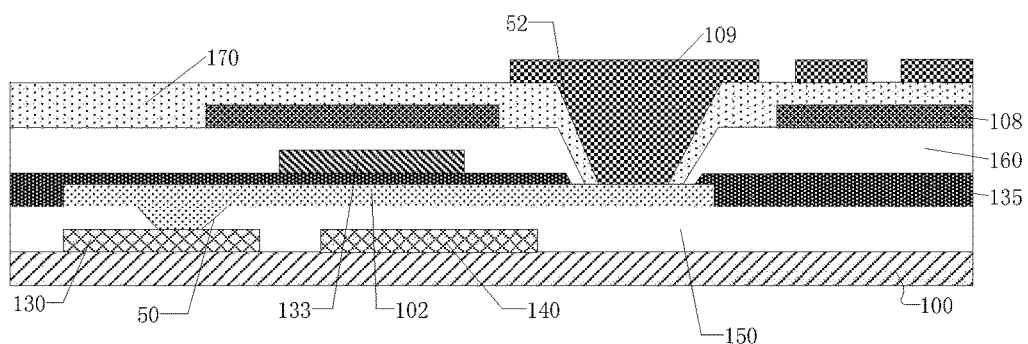

For example, as shown in FIG. 8a and FIG. 8b, a conductive film is deposited on the third insulation layer 170, and then the pixel electrode 109 is formed by patterning the conductive film. The pixel electrode 109 is electrically connected with the active layer 102 through the second via hole 51 and the third via hole 52, so as to receive a data signal transmitted by the active layer 102. The pixel electrode 109 for example is a slit electrode.

For example, a material of the first electrode 130 comprises copper base metals, aluminum base metals, nickel base metals and so on. For example, materials of the first insulation layer 150, the second insulation layer 160 and the third insulation layer 170 comprise silicon nitride (SiNx), silicon oxide (SiOx), silicon oxynitride (SiNxOy) or other suitable materials; for example, the first insulation layer 150, the second insulation layer 160, the third insulation layer 170 and the gate insulation layer 135 respectively is a single layer structures or a multilayer structure formed by one or more of the above described materials.

For example, materials of the first gate electrode 133 and the gate line 136 are copper base metals, aluminum base metals, nickel base metals and so on. For example, the first gate electrode 133 is a single layer structure or a multilayer structure formed by one or more of the above described metal alloys.

For example, the common electrode 108 and the pixel electrode 109 is a single layer structure or a multilayer structure formed by transparent conductive materials, metal materials or other suitable materials; for example, materials for forming the common electrode 108 and the pixel electrode 109 comprise indium tin oxide (ITO), indium zinc oxide (IZO), indium gallium oxide (IGO), gallium zinc oxide (GZO), zinc oxide (ZnO), indium oxide (In2O3), aluminum zinc oxide (AZO) and carbon nanotubes, etc.

For example, a material of the active layer 102 is amorphous silicon, polysilicon, oxide semiconductor and so on. The polysilicon for example is a high temperature polysilicon or a low temperature polysilicon; for example, the oxide semiconductor is indium gallium zinc oxide (IGZO), indium zinc oxide (IZO), zinc oxide (ZnO) or gallium zinc oxide (GZO), etc. For example, the active layer 102 is a single layer structure or a multilayer structure formed by any one of the amorphous silicon, polysilicon or oxide semiconductor.

For example, the insulation film and the semiconductor film are deposited by a chemical vapor deposition (CVD) method, such as a plasma enhanced chemical vapor deposition (PECVD) method, a low pressure chemical vapor deposition (LPCVD) method and so on, but the examples of the chemical vapor deposition (CVD) method are not limited thereto.

For example, the metal thin film and the transparent conductive thin film are deposited by a vapor deposition method, a magnetron sputtering method, a vacuum evaporation method or other suitable processing methods.

Figure 9A:
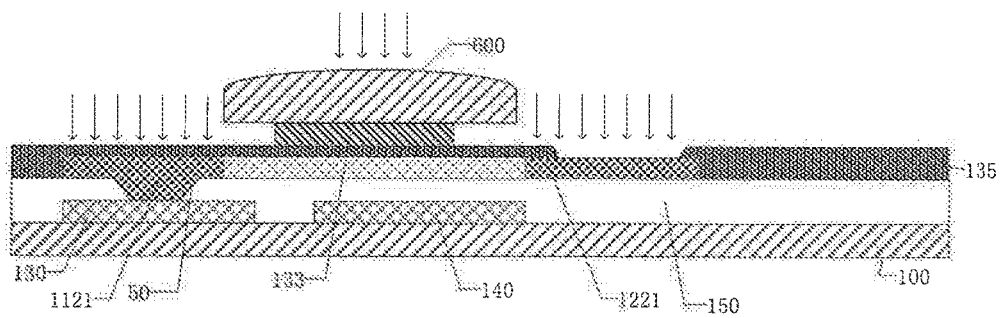
FIGS. 9a-9c are structural views of a lightly drain doping process of a polysilicon active layer of the array substrate provided by the embodiments of the present disclosure.
Figure 9B:
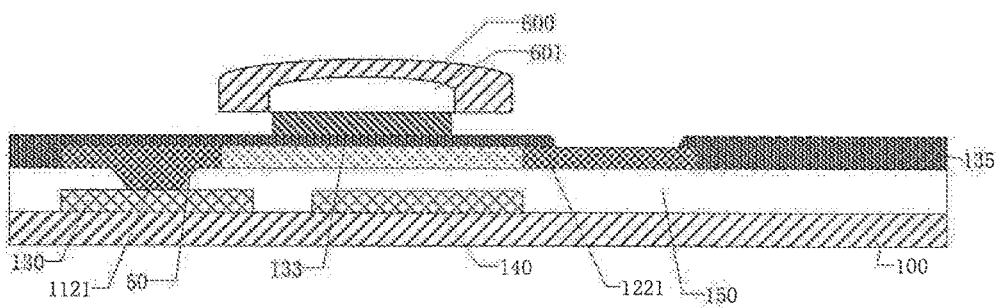
Figure 9C:
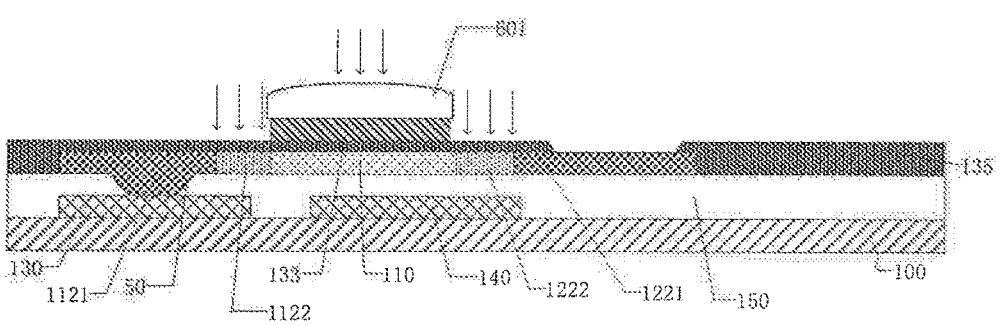

In an example of the embodiment, in a case that the active layer 102 is the polysilicon layer (such as the high temperature polysilicon layer or the low temperature polysilicon layer), the polysilicon layer is doped to form a channel region. FIGS. 9a-9c are schematic diagrams of forming the active layer by using a lightly drain doping (LDD) process provided by the embodiment.

For example, an amorphous silicon (a-Si) film is formed on the first insulation layer by using a plasma enhanced chemical vapor deposition method and so on; and then the amorphous silicon film is converted into the polysilicon (p-Si) film by a crystallization process. For example, the crystallization process is an excimer laser annealing (ELA) process, a metal induced crystallization (MIC) process or a continuous wave laser transverse crystallization (CLC) process and so on. In the low temperature polysilicon (LTPS) technology, ELA process is the most frequently used method for forming the p-Si film. In the LTPS technology, the amorphous silicon film is crystallized into the polysilicon film for example at a temperature below 600° C.

For example, before carrying out the crystallization process, dehydrogenation of the amorphous silicon (a-Si) film is carried out at a high temperature to ensure that hydrogen content of the amorphous silicon (a-Si) drops below 1%, and thus prevent hydrogen from boiling caused by high energy during the ELA scanning, which leads to cracking of the a-Si thin film.

In the example, for example, the polysilicon film is doped gradually several times by using the formed first gate electrode 133 as a doping mask, so as to achieve a self-aligning process, reduce the process steps and decrease the manufacturing cost.

For example, as shown in FIG. 9a, the amorphous silicon (a-Si) film is deposited on the first insulation layer 150 by using the plasma enhanced chemical vapor deposition method and so on; polysilicon (p-Si) film is obtained by the ELA annealing process and then the polysilicon film is patterned; next the gate insulation layer 135 is formed; then the gate metal thin film is formed by the vapor deposition method, the magnetron sputtering method or the vacuum evaporation method, etc., a photoresist film is coated on the gate metal thin film, the photoresist film is sequentially exposed, developed and etched to form a photoresist pattern, and the gate metal thin film is etched with the photoresist pattern as a mask by a wet etching method to form the first gate electrode 133. As shown in FIG. 9a, a first photoresist pattern 600 is remained on the first gate electrode 133; due to the properties of the wet etching method, a width of the first gate electrode 133 is less than a width of the first photoresist pattern 600. Then, a N type heavily ion implantation doping process is performed on the polysilicon (p-Si) film by taking the first photoresist pattern 600 as a mask, so as to form a heavily doped source region 1121 and a heavily doped drain region 1221. For example, the heavily doped source region 1121 and the heavily doped drain region 1221 are referred as first doped regions. For example, the implanted N type ion is a phosphorus ion.

For example, as shown in FIG. 9b, an ashing process is performed on the first photoresist pattern 600. The ashing process, for example, comprises thinning and narrowing the first photoresist pattern 600 to form a second photoresist pattern 601, and therefore regions, which are not doped before due to being shielded by the first photoresist pattern 600, on two sides of the first gate electrode 133 are exposed.

For example, as shown in FIG. 9c, a N type lightly ion implantation doping process is performed on the polysilicon (p-Si) film by taking the second photoresist pattern 601 as a mask, the regions not doped before due to being shielded by the first photoresist pattern 600 are doped, so as to form a lightly doped source region 1122 and a lightly doped drain region 1222. For example, the lightly doped source region 1122 and the lightly doped drain region 1222 are referred as second doped regions. For example, the implanted N type ion is the phosphorus ion. Ion concentration in the lightly ion implantation doping process is lower than ion concentration in the heavily ion implantation doping process, therefore ion concentration of the second doped regions is less than ion concentration of the first doped regions.

For example, before forming the channel region 110, the ashing process is performed on the first photoresist pattern 600 several times, a new photoresist pattern is formed after each ashing process, and a ion implantation doping process with a different ion concentration is performed on the polysilicon (p-Si) film by taking the new photoresist pattern as a mask, so as to form a plurality of doped source regions with different ion concentrations and a plurality of doped drain regions with different ion concentrations. For example, in the ion implantation doping processes with different ion concentrations, the doping concentrations are reduced in turn, so the concentration of the doped ion is increased gradually from a center to edges on two sides of the polysilicon (p-Si) film, and the center is the channel region 110.

The photoresist pattern remained on the first gate electrode 133 is removed after finishing the ion implantation doping process, therefore the first gate electrode 133 and the channel region 110 are obtained.

It is to be noted that, the above ashing process for example comprises an etching process; and for example, the etching process is a dry etching process.

Although the electron mobility of the polysilicon is high compared with that of the amorphous silicon, internal resistance of an electron in the polysilicon is smaller, which easily leads to a leakage current in a turn-off state in the thin film transistor (TFT) using the polysilicon as the active layer, so as to affect normal operation of the polysilicon TFT. The lightly doping process performed on the source region and the drain region of the active layer of the TFT suppresses the leakage current of the polysilicon TFT and improves performance of the polysilicon TFT.

Embodiment 2

Figure 10:
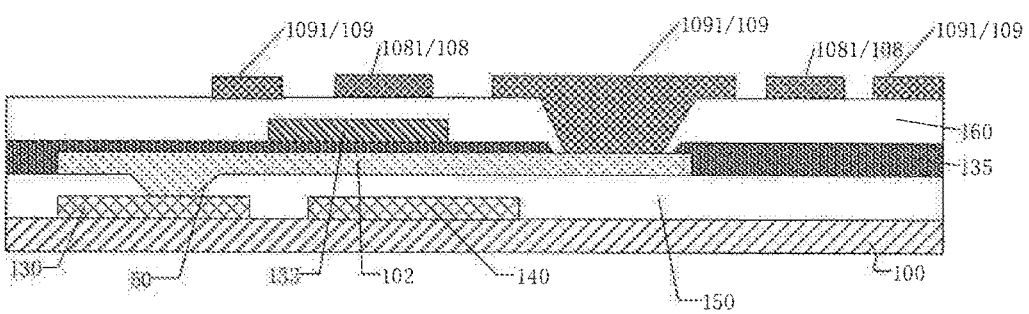
FIG. 10 is another schematic diagram of the sectional structure of the array substrate provided by the embodiments of the present disclosure.

FIG. 10 shows a schematic diagram of a sectional structure of an array substrate provided by the embodiment 2. In the embodiment 1, the common electrode 108 is formed on the second insulation layer 160, the third insulation layer 170 is formed on the common electrode 108, and the pixel electrode 109 is formed on the third insulation layer 170. In the array substrate provided by the embodiment 2, the pixel electrode 109 and the common electrode 108 are located in a same layer, namely both of them are provided on the second insulation layer 160. For example, the pixel electrode 109 and the common electrode 108 both have a comb structure and are at least partially interdigitated with each other. Branch electrode strips 1091 of the pixel electrode 109 and branch electrode strips 1081 of the common electrode 108 are alternately arranged with each other.

The array substrate of the present embodiment, for example, is used in an in-plane switching (IPS) type liquid crystal display panel.

For example, a manufacturing method of the array substrate provided by the present embodiment has identical steps with the embodiment 1 before forming the pixel electrode 109; for example, after forming the second insulation layer 160, a transparent conductive thin film is formed on the second insulation layer 160, and the transparent conductive thin film is patterned to obtain the pixel electrode 109 and the common electrode 108. The pixel electrode 109 is electrically connected with the active layer 102 through the second via hole 51 formed in the second insulation layer 160. A passivation layer for example is further formed on the pixel electrode 109 and the common electrode 108.

Embodiment 3

Figure 11:
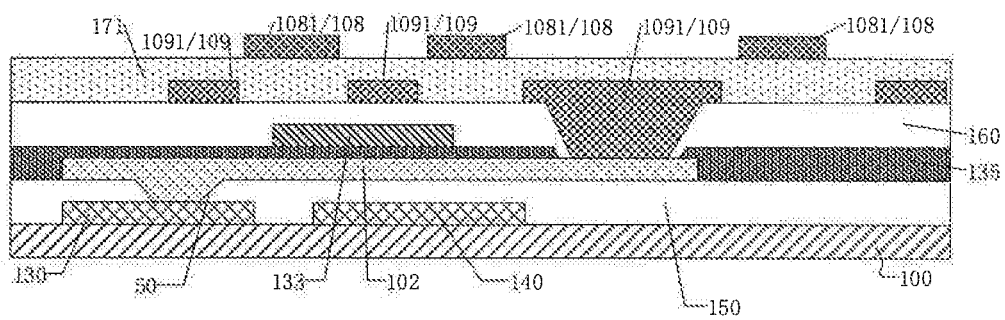
FIG. 11 is another schematic diagram of the sectional structure of the array substrate provided by the embodiments of the present disclosure.

FIG. 11 shows a schematic diagram of a sectional structure of an array substrate provided by the embodiment 3. In the embodiment 1, the common electrode 108 is formed on the second insulation layer 160, the third insulation layer 170 is formed on the common electrode 108, and the pixel electrode 109 is formed on the third insulation layer 170. In the array substrate provided by the embodiment 3, a formation order of the pixel electrode 109 and the common electrode 108 is changed, that is, the common electrode 108 is located on the pixel electrode 109. The pixel electrode 109 and the common electrode 108, for example, are slit electrodes, and slits of the pixel electrode 109 and slits of the common electrode 108 overlap with each other or are do not overlap with each other. The pixel electrode 109 comprises the branch electrode strips 1091 spaced apart from each other by the slits, and the common electrode 108 comprises the branch electrode strips 1081 spaced apart from each other by the slits.

The array substrate of the present embodiment, for example, also is used in the ADS type liquid crystal display panel.

For example, a manufacturing method of the array substrate provided by the present embodiment has identical steps with the embodiment 1 before forming the pixel electrode 109; for example, after forming the second insulation layer 160, a conductive film is deposited on the second insulation layer 160, and the conductive film is patterned to form the pixel electrode 109, the pixel electrode 109 is electrically connected with the active layer 102 through the second via hole 51 in the second insulation layer 160. A fourth insulation layer 171 is formed on the pixel electrode 109 to cover the pixel electrode 109, then a conductive film is deposited on the fourth insulation layer 171, and the conductive film is patterned to form the common electrode 108.

For example, a material of the fourth insulation layer 171 comprises silicon nitride (SiNx), silicon oxide (SiOx), silicon oxynitride (SiNxOy) or other suitable materials; for example, the fourth insulation layer 171 is a single layer structure or a multilayer structure formed by one or more of the above described materials. The other layers of the array substrate in the present embodiment for example are formed by materials described in the embodiment 1.

Embodiment 4

Figure 12:
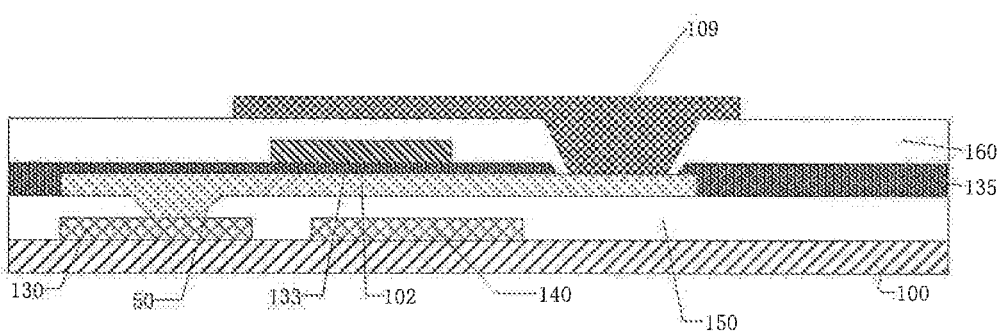
FIG. 12 is another schematic diagram of the sectional structure of the array substrate provided by the embodiments of the present disclosure.

FIG. 12 shows a schematic diagram of a sectional structure of an array substrate provided by the embodiment 4. In the array substrate provided by the embodiment 4, the pixel electrode 109 is merely provided, and the common electrode 108 is not disposed on the array substrate. The array substrate of the present embodiment, for example, is used in a vertical electric field type liquid crystal display panel, or is used in, for example, an organic light-emitting diode (OLED) display panel, an electronic paper display panel and the like. For example, in the vertical electric field type liquid crystal display panel, the common electrode is disposed on an opposed substrate which is opposite to the array substrate.

For example, a manufacturing method of the array substrate provided by the present embodiment is basically similar to the manufacturing method of the embodiment 1; after forming the second insulation layer 160, a transparent conductive film, for example, is formed on the second insulation layer 160, and the transparent conductive film is patterned to obtained the pixel electrode 109, the pixel electrode 109, for example, is a plate electrode. The pixel electrode 109 is electrically connected with the active layer 102 through the second via hole 51. A passivation layer for example is further formed on the pixel electrode 109.

Embodiment 5

The thin film transistor of the array substrate in the above embodiment 1 to embodiment 4 is a thin film transistor with a single gate structure, but the present disclosure is not limited thereto; the array substrate for example comprises a second gate electrode disposed on the gate insulation layer, the second gate electrode overlaps with at least part of the active layer in the direction perpendicular to the base substrate, so that the thin film transistor with a double gate structure is obtained.

Figure 13A:
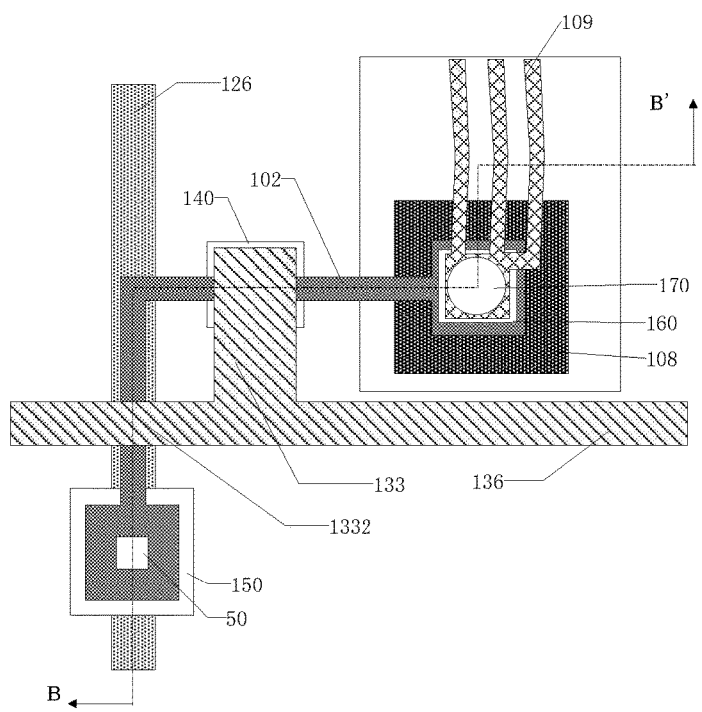
FIG. 13a is another planar view of the array substrate provided by the embodiments of the present disclosure.
Figure 13B:
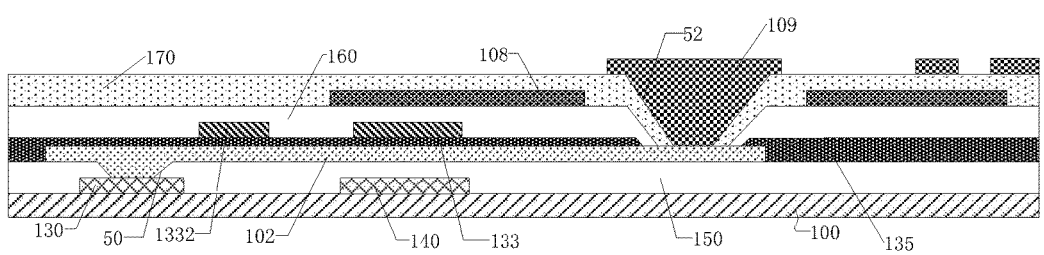

FIG. 13a shows a planar view of the array substrate provided by the embodiment 5, and FIG. 13b is a schematic diagram of a sectional structure taken along a line B-B' in FIG. 13a. In the array substrate provided by the embodiment 5, a first gate electrode 133 and a second gate electrode 1332 are formed on the gate insulation layer 135, so as to form the double gate structure, the double gate structure more effectively suppresses leakage current of the TFT; the second gate electrode 1332 is a part of the gate line 136, the part of the gate line 136 overlaps with at least part of the active layer in the direction perpendicular to the base substrate 100. As shown in FIG. 13a, in the present embodiment, the second gate electrode 1332 for example adopts a structure similar to the first gate electrode 133, namely the gate line 136 is branched to form the second gate electrode 1332, but the embodiment of the present disclosure is not limited to the specific structure.

The other layers of the array substrate in the present embodiment for example have the same structures as the embodiment 1, so that the pixel electrode 109 is disposed on the common electrode 108. The other layers of the array substrate in the present embodiment for example have the same structures as the embodiment 2, the embodiment 3 or the embodiment 4, which is not limited thereto. Moreover, the double gate structure provided by the embodiment may be used in other embodiments of the present disclosure, such as the embodiment 1 to embodiment 4 mentioned above.

For example, a manufacturing method of the array substrate provided by the present embodiment is basically similar to the manufacturing method of the embodiment 1; during the first gate electrode 133 and the gate line 136 are formed, as shown in FIG. 13a, a part branched from the gate line 136 overlaps with at least part of the active layer in the direction perpendicular to the base substrate 100 so as to form the first gate electrode 133, the gate line 136 extends in a horizontal direction so as to overlap with at least part of the active layer in the direction perpendicular to the base substrate 100, so that the overlapped part of the gate line 136 forms the second gate electrode 1332. The first electrode 130, the active layer 102, the first gate electrode 133, the second gate electrode 1332, the gate insulation layer 135 and the pixel electrode 109 constitute the thin film transistor with the double gate structure, which more effectively suppresses the leakage current of the thin film transistor. The second gate electrode 1332 is formed by a part of the gate line 136, the first gate electrode 133 and the second gate electrode 1332 are formed on the gate insulation layer 135 by a same patterning process, the second gate electrode 1332 does not need to be formed individually, so that the patterning process of the thin film transistor with the double gate structure is simpler. In addition, the manufacturing method of the array substrate provided by the present embodiment for example is similar to the manufacturing method of the embodiment 2, the embodiment 3 or the embodiment 4, which is not limited thereto.

Embodiment 6

The embodiment of the present disclosure provides a display device, comprising the array substrate described in any one of the above embodiments. The display device for example is a television, a digital camera, a mobile phone, a watch, a tablet computer, a notebook computer, a GPS, or any product or components having any display function.

For example, an example of the display device is a liquid crystal display device, which comprises the array substrate and an opposed substrate which are disposed opposite to each other to form a liquid crystal cell, and liquid crystal materials are filled in the liquid crystal cell. The opposed substrate, for example, is a color filter substrate. The pixel electrode of each pixel region in the array substrate is configured to control rotation degree of the liquid crystal materials by applying an electrical field, so as to implement display operation. In general, the liquid crystal display device comprises a backlight source, and the backlight source, for example, is disposed at a rear side of the array substrate relative to the opposed substrate.

For example, another example of the display device is an organic light-emitting diode (OLED) display device, a laminated layer of an organic light-emitting material is formed on the array substrate, the pixel electrode of each pixel region acts as an anode or cathode to drive the organic light-emitting material to emit light, so as to implement display operation.

For example, another example of the display device is an electronic paper display device, an electronic ink layer is formed on the array substrate, and a voltage is applied to the pixel electrode of each pixel region to drive charged micro particles in the electronic ink of the electronic ink layer to move, so as to implement display operation.

It is to be noted that, for clarity, the embodiments of the present disclosure do not describe all structures of the display device in detail. In order to achieve a necessary function of the display device, a person having ordinary skill in the art may set up other structure(s) not described. No limitation will be given here in the present disclosure.

Embodiments of the present disclosure provide the manufacturing method of the array substrate, the array substrate and the display device, and have at least one of following beneficial effects:

(1) The manufacturing method of the array substrate saves a process of the light shielding layer (LS layer) and a multi deposition process, reduces the manufacturing process steps of the array substrate, optimizes a process flow, shortens production time, decreases production cost, and effectively improves production capacity.

(2) In the manufacturing method of the array substrate, before forming the active layer, the via hole for connecting the active layer with the source-drain electrode is formed, so that the active layer is not etched when etching the via hole, the quality of the active layer is improved. In addition, the contact mode between the source-drain electrode and the active layer is optimized from the mode of side contact to the mode of surface contact, so as to reduce the contact resistance.

(3) In the array substrate, the source-drain electrode is connected with the active layer by a single hole, so that conduction relationship between the source-drain electrode and the active layer is optimized.

(4) The embodiment of the array substrate is provided with the thin film transistor with the double gate structure, which more effectively suppresses the leakage current of the thin film transistor.

For the present disclosure, the following statements should be noted:

(1) The accompanying drawings involve only the structure(s) in connection with the embodiment(s) of the present disclosure, and other structure(s) may be referred to common design(s).

(2) For the purpose of clarity only, in accompanying drawings for illustrating the embodiment(s) of the present disclosure, the thickness of a layer or area may be enlarged or narrowed, that is, the drawings are not drawn in a real scale.

(3) In case of no conflict, features in one embodiment or in different embodiments can be combined to obtain new embodiment(s).

Although detailed description has been given above to the present disclosure with general description and embodiments, it shall be apparent to those skilled in the art that some modifications or improvements may be made on the basis of the embodiments of the present disclosure. Therefore, all the modifications or improvements made without departing from the spirit of the present disclosure shall all fall within the scope of protection of the present disclosure. Therefore, the protection scope of the present disclosure should be based on the protection scope of the claims.

The application claims priority to the Chinese patent application No. 201611091449.9, filed Dec. 1, 2016, the entire disclosure of which is incorporated herein by reference as part of the present application.

What is claimed is:

1. A manufacturing method of an array substrate, comprising:
    providing a base substrate;
    forming a first electrode on the base substrate;
    forming a first insulation layer on a side, facing away from the base substrate, of the first electrode, and forming a first via hole in the first insulation layer;
    forming an active layer on a side, facing away from the base substrate, of the first insulation layer, wherein the active layer extends into the first via hole to directly contact and be electrically connected with the first electrode;
    forming a gate insulation layer on a side, facing away from the base substrate, of the active layer;
    forming a first gate electrode on a side, facing away from the base substrate, of the gate insulation layer, the first gate electrode overlapping with at least part of the active layer in a direction perpendicular to the base substrate;
    forming a second insulation layer on a side, facing away from the base substrate, of the first gate electrode and the gate insulation layer, and forming a second via hole in the second insulation layer and the gate insulation layer; and
    forming a pixel electrode on a side, facing away from the base substrate, of the second insulation layer, the pixel electrode being electrically connected with the active layer through the second via hole.

2. The manufacturing method according to claim 1, further comprising:
    forming a common electrode on the side, facing away from the base substrate, of the second insulation layer,
    wherein the common electrode and the pixel electrode are located in a same layer, and branch electrode strips of the common electrode and branch electrode strips of the pixel electrode are at least partially interdigitated with each other.

3. The manufacturing method according to claim 1, further comprising:
    forming a common electrode on the side, facing away from the base substrate, of the second insulation layer;
    forming a third insulation layer on a side, facing away from the base substrate, of the common electrode, and forming a third via hole overlapping with the second via hole in the third insulation layer;
    wherein the pixel electrode is formed on a side, facing away from the base substrate, of the third insulation layer, and the pixel electrode is electrically connected with the active layer through the second via hole and the third via hole.

4. The manufacturing method according to claim 1, further comprising:
    forming a fourth insulation layer on a side, facing away from the base substrate, of the pixel electrode; and
    forming a common electrode on a side, facing away from the base substrate, of the fourth insulation layer.

5. The manufacturing method according to claim 1, further comprising:
    forming a light shielding layer during forming the first electrode,
    wherein the light shielding layer overlaps with at least part of the active layer in the direction perpendicular to the base substrate.

6. The manufacturing method according to claim 1, wherein the active layer is an amorphous silicon layer, a polysilicon layer or an oxide semiconductor layer.

7. The manufacturing method according to claim 6, wherein the active layer is the polysilicon layer, and the manufacturing method of the array substrate further comprises:
    doping the polysilicon layer to obtain a channel region, a first doping region located on two sides of the channel region, and a second doping region located on a side of the first doping region away from the channel region,
    wherein doping concentration of the first doping region is less than doping concentration of the second doping region.

8. The manufacturing method according to claim 1, further comprising:
    forming a second gate electrode on the side, facing away from the base substrate, of the gate insulation layer,
    wherein the second gate electrode overlaps with at least part of the active layer in the direction perpendicular to the base substrate.

9. An array substrate, comprising:
    a base substrate;
    a first electrode disposed on the base substrate;
    a first insulation layer disposed on a side, facing away from the base substrate, of the first electrode, and a first via hole disposed in the first insulation layer;
    an active layer disposed on a side, facing away from the base substrate, of the first insulation layer, wherein the active layer extends into the first via hole to directly contact and be electrically connected with the first electrode;
    a gate insulation layer disposed on a side, facing away from the base substrate, of the active layer;
    a first gate electrode disposed on a side, facing away from the base substrate, of the gate insulation layer, and the first gate electrode overlapping with at least part of the active layer in a direction perpendicular to the base substrate;
    a second insulation layer disposed on a side, facing away from the base substrate, of the gate insulation layer and the first gate electrode, and a second via hole disposed in the gate insulation layer and the second insulation layer; and
    a pixel electrode disposed on a side, facing away from the base substrate, of the second insulation layer, the pixel electrode being electrically connected with the active layer through the second via hole.

10. The array substrate according to claim 9, further comprising:
    a common electrode disposed on the side, facing away from the base substrate, of the second insulation layer,
    wherein the common electrode and the pixel electrode are located in a same layer, and branch electrode strips of the common electrode and branch electrode strips of the pixel electrode are at least partially interdigitated with each other.

11. The array substrate according to claim 9, further comprising:
    a common electrode disposed on the side, facing away from the base substrate, of the second insulation layer;

a third insulation layer disposed on a side, facing away from the base substrate, of the common electrode, wherein a third via hole, which overlaps with the second via hole, is disposed in the third insulation layer, and the pixel electrode is disposed on a side, facing away from the base substrate, of the third insulation layer and electrically connected with the active layer through the second via hole and the third via hole.

12. The array substrate according to claim 9, further comprising:

a fourth insulation layer disposed on a side, facing away from the base substrate, of the pixel electrode; and a common electrode disposed on a side, facing away from the base substrate of the fourth insulation layer.

13. The array substrate according to claim 9, further comprising:

a light shielding layer disposed in a same layer with the first electrode, wherein the light shield layer overlaps with at least part of the active layer in the direction perpendicular to the base substrate.

14. The array substrate according to claim 9, wherein the active layer is an amorphous silicon layer, a polysilicon layer or an oxide semiconductor layer.

15. The array substrate according to claim 9, further comprising:

a second gate electrode disposed on the side, facing away from the base substrate, of the gate insulation layer, wherein the second gate electrode overlaps with at least part of the active layer in the direction perpendicular to the base substrate.

16. A display device, comprising the array substrate according to claim 9.

17. The array substrate according to claim 1, wherein the first electrode is a source electrode or a drain electrode, and a part of the pixel electrode contacting the active layer is the drain electrode or the source electrode, in the direction perpendicular to the base substrate, the source electrode and the drain electrode are respectively on two opposite sides of the active layer.

* * * * *